United States Patent
Zhang et al.

(10) Patent No.: US 10,644,033 B2
(45) Date of Patent: May 5, 2020

(54) SURFACE TREATMENT METHOD OF GLASS SUBSTRATE HAVING PIT ON SURFACE THEREOF, PRODUCTION METHOD OF ARRAY SUBSTRATE, AND ARRAY SUBSTRATE

(71) Applicants: BOE Technology Group Co., Ltd., Beijing (CN); Hefei Xinsheng Optoelectronics Technology Co., Ltd., Anhui (CN)

(72) Inventors: Donghui Zhang, Beijing (CN); Hao Yin, Beijing (CN); Chuan Chen, Beijing (CN); Xiaoye Ma, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 16/129,556

(22) Filed: Sep. 12, 2018

(65) Prior Publication Data
US 2019/0273097 A1 Sep. 5, 2019

(30) Foreign Application Priority Data
Mar. 5, 2018 (CN) .......................... 2018 1 0177550

(51) Int. Cl.
*H01L 21/302* (2006.01)
*H01L 27/12* (2006.01)
*H01L 21/02* (2006.01)
*H01L 21/3213* (2006.01)
*H01L 29/423* (2006.01)
*H01L 29/66* (2006.01)

(52) U.S. Cl.
CPC .... *H01L 27/1218* (2013.01); *H01L 21/02164* (2013.01); *H01L 21/02282* (2013.01); *H01L 21/02359* (2013.01); *H01L 21/32134* (2013.01); *H01L 27/1262* (2013.01); *H01L 29/42384* (2013.01); *H01L 29/66545* (2013.01)

(58) Field of Classification Search
CPC ......... H01L 21/02164; H01L 21/02282; H01L 21/02359; H01L 21/32134; H01L 27/1218; H01L 27/1262
USPC ........................................... 257/72; 438/692
See application file for complete search history.

(56) References Cited

U.S. PATENT DOCUMENTS 5,354,715 A * 10/1994 Wang .................... C23C 16/402
438/699

* cited by examiner

*Primary Examiner* — Tan N Tran
(74) *Attorney, Agent, or Firm* — McDermott Will & Emery LLP

(57) ABSTRACT

There is provided a surface treatment method of a glass substrate having a pit on a surface thereof, a production method of an array substrate comprising this method, and an array substrate. The method includes: forming a layer of $SiO_2$ sol at least at a side wall of the pit; and drying the layer of $SiO_2$ sol to form a smoothening layer so as to smoothen an upper edge and a lower edge of the side wall of the pit.

11 Claims, 2 Drawing Sheets

SURFACE TREATMENT METHOD OF GLASS SUBSTRATE HAVING PIT ON SURFACE THEREOF, PRODUCTION METHOD OF ARRAY SUBSTRATE, AND ARRAY SUBSTRATE

CROSS-REFERENCE TO RELATED APPLICATION

This disclosure claims the priority of Chinese Patent Application No. 201810177550.9 filed on Mar. 5, 2018, which is incorporated herein in its entirety by reference.

TECHNICAL FIELD

Embodiments of this disclosure relates to the technical field of display substrates, and more particularly to a surface treatment method of a glass substrate having a pit on a surface thereof, a production method of an array substrate, and an array substrate.

BACKGROUND

A TFT-LCD (thin film transistor-liquid crystal display) typically employs a glass substrate. In the production process of a display, it is desired to maintain the flatness of the surface of the glass substrate as possible, so as to ensure that a high-quality film layer can be formed on the glass substrate.

SUMMARY

In one aspect, this disclosure provides a surface treatment method of a glass substrate having a pit on a surface thereof, wherein the surface treatment method comprises:
  forming a layer of $SiO_2$ sol at least at a side wall of the pit; and
  drying the layer of $SiO_2$ sol to form a smoothening layer so as to smoothen an upper edge and a lower edge of the side wall of the pit.
Optionally, the smoothening layer comprises $SiO_2$.
Optionally, a concentration of $SiO_2$ in the $SiO_2$ sol is about 0.005-0.02 g/ml, such as 0.01 g/ml.
Optionally, the $SiO_2$ sol is prepared by mixing absolute ethanol, aqueous ammonia, and tetraethyl orthosilicate.
Optionally, a molar ratio of aqueous ammonia to tetraethyl orthosilicate is about 3:1-5:1, such as 4:1.
Optionally, the surface treatment method further comprises: allowing $SiO_2$ colloidal particles to be negatively charged, and forming a layer of a sol having positively charged colloidal particles before forming the layer of $SiO_2$ sol.
Optionally, a pH value of the $SiO_2$ sol is adjusted to about 7.1-8.0, such as 7.5.
Optionally, the sol having positively charged colloidal particles comprises alkali metal cations, and the smoothening layer comprises an alkali metal silicate.
Optionally, the sol having positively charged colloidal particles is a sodium polystyrene sulfonate sol, and the smoothening layer comprises sodium silicate.
Optionally, a temperature of the drying is about 220-280° C., such as 250° C.
In another aspect, this disclosure provides a production method of an array substrate, comprising the surface treatment method described above.
Optionally, the production method comprises:
  a step of forming a gate electrode on a glass substrate by etching, wherein a pit is formed on a surface of the glass substrate in the etching; and
  a step of performing surface treatment on the glass substrate by the surface treatment method after the step of forming a gate electrode so as to smoothen an upper edge and a lower edge of the side wall of the pit.
Optionally, the production method comprises:
  a step of removing the gate electrode after the step of forming a gate electrode;
  the step of performing the surface treatment after the step of removing the gate electrode; and
  a step of forming a gate electrode again on the glass substrate after the step of performing the surface treatment, wherein an orthographic projection of the gate electrode formed again on the glass substrate covers an orthographic projection of a side wall of the pit on the glass substrate.
Optionally, the production method further comprises:
  a step of forming a gate electrode insulating layer or a source and drain electrode layer after the step of performing the surface treatment, wherein an orthographic projection of the gate electrode insulating layer or the source and drain electrode layer on the glass substrate covers an orthographic projection of a side wall of the pit on the glass substrate.
In another aspect, this disclosure provides an array substrate, comprising a glass substrate, wherein
  a surface of the glass substrate has a pit, a side wall of the pit has a $SiO_2$ layer or a silicate layer, and the $SiO_2$ layer or the silicate layer smoothens an upper edge and a lower edge of the side wall of the pit.
Optionally, the array substrate comprises a gate electrode on the glass substrate, wherein an orthographic projection of the gate electrode on the glass substrate covers an orthographic projection of a side wall of the pit on the glass substrate.
Optionally, the array substrate comprises a gate electrode insulating layer or a source and drain electrode layer, wherein an orthographic projection of the gate electrode insulating layer or the source and drain electrode layer on the glass substrate covers an orthographic projection of a side wall of the pit on the glass substrate.
Optionally, the silicate layer is a sodium silicate layer.
Adaptable further aspects and scopes become conspicuous from the description provided herein. It is to be understood that respective aspects of this application may be implemented alone or in combination with one or more other aspects. It is also to be understood that the description and specific embodiments herein are only for the purpose of illustration and are not intended to limit the scope of this application.

DESCRIPTION OF DRAWINGS

Accompanying drawings described herein are only used for the purpose of illustration of selected embodiments, are not all possible embodiments, and are not intended to limit the scope of this application, in which.

Throughout respective views of these accompanying drawings, corresponding reference numerals indicate corresponding members or features.

DESCRIPTION OF EMBODIMENTS

The flow chart depicted in this disclosure is merely an example. There may be many variations of this flow chart or steps described therein without departing from the spirit of this disclosure. For example, the steps may be performed in different orders, or steps may be added, deleted, or modified. These variations are considered to be a part of aspects sought to be protected.

Exemplary embodiments will now be described more fully with reference to accompanying drawings.

An embodiment of this disclosure provides a method for at least partly smoothening a glass substrate having a pit in an array substrate. For example, the method can smoothen a pit on a surface of the glass substrate, so that the possibility of the occurrence of open circuit badness of a conductive layer formed on the glass substrate may be reduced and optical properties of the glass substrate may be improved.

In an exemplary embodiment of this disclosure, a material for repairing a glass substrate comprises a $SiO_2$ sol. For example, it may be a $SiO_2$ sol.

In an exemplary embodiment of this disclosure, the $SiO_2$ sol is prepared by mixing absolute ethanol, aqueous ammonia, and tetraethyl orthosilicate. It is to be indicated that absolute ethanol is used as a solvent and aqueous ammonia is used as a catalyst. The chemical reaction formula is as represented by formula (1).

$$(C_2H_5O)_4Si+2H_2O=4C_2H_5OH+SiO_2 \quad (1)$$

In an exemplary embodiment of this disclosure, a molar ratio of aqueous ammonia to tetraethyl orthosilicate is 4:1.

After the mixed solution described above is prepared, the concentration of $SiO_2$ in the $SiO_2$ sol is adjusted to 0.01 g/ml.

Next, a surface treatment method for repairing a glass substrate according to an embodiment of this disclosure will be described.

Figure 1:
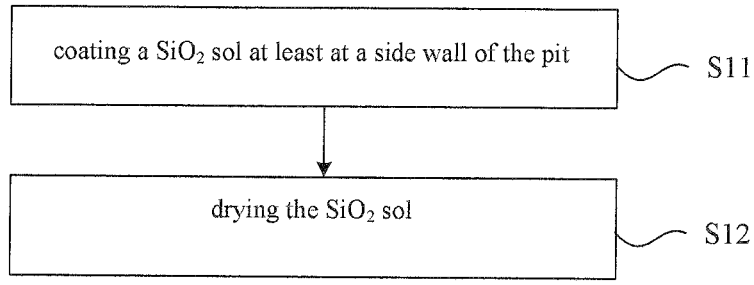
FIG. 1 is a flow chart illustrating a surface treatment method according to an embodiment of this disclosure.
Figure 2A:
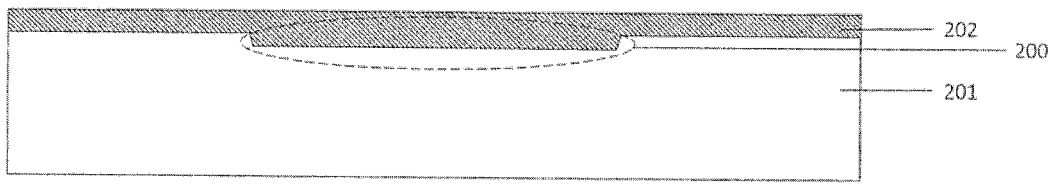
FIGS. 2a to 2b are schematic diagrams illustrating the formation of a smoothening layer on a glass substrate according to an embodiment of this disclosure.
Figure 2B:
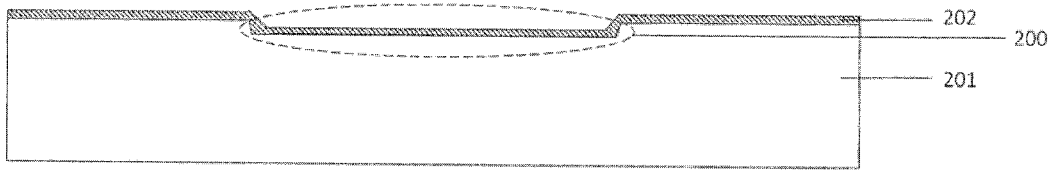

FIG. 1 is a flow chart illustrating a surface treatment method for repairing a glass substrate according to an embodiment of this disclosure. FIGS. 2a to 2b are schematic diagrams illustrating the formation of a smoothening layer on a glass substrate according to an embodiment of this disclosure.

As shown in S11 in FIG. 1 and FIG. 2a, a $SiO_2$ sol 202 is coated on a glass substrate 201 having a pit. Particularly, a surface of the glass substrate 201 has a pit 200. A $SiO_2$ sol 202 is coated at least at a side wall of the pit 200 of the glass substrate 201. Optionally, as shown in FIG. 2a, a $SiO_2$ sol 202 is coated on the surface of the glass substrate 201 and at the bottom of the pit 200. Since the growth rate of the film in the corner of the pit is higher than the growth rates of other parts of the film, the height difference in edge areas of the pit may be effectively reduced. An upper edge and a lower edge of the side wall of the pit are smoothened. When a subsequent film layer, for example a gate electrode layer, a gate electrode insulating layer, or a source and drain electrode layer, is formed at the side wall of the pit, the film layer will not be easily subjected to defects such as cracking.

As shown in S12 in FIG. 1 and FIG. 2b, the $SiO_2$ sol 202 is dried to at least partly smoothen the pit 200, so that a "repair" effect is exerted on the pit of the glass substrate to allow the surface of the glass substrate after reparation is flatter compared to the surface of the glass substrate before repair.

In the figure, the side wall is inclined, but may also be substantially vertical. This is not limited in this disclosure.

The terms smoothening and planarizing used in this disclosure may be interchangeably used, and include, but are not limited to, reducing the height difference between upper and lower edges of the side wall or allowing upper and lower edges of the side wall to be rounded. Smoothening or planarizing may allow that the cracking and failure of the subsequent film layer formed at the side wall will not easily occur.

In FIG. 2b, a smoothening layer formed after the $SiO_2$ sol 202 is dried is a $SiO_2$ layer.

In an exemplary embodiment of this disclosure, the temperature of drying is about 250° C.

Next, a surface treatment method for repairing a glass substrate according to another embodiment of this disclosure will be described.

Figure 3:
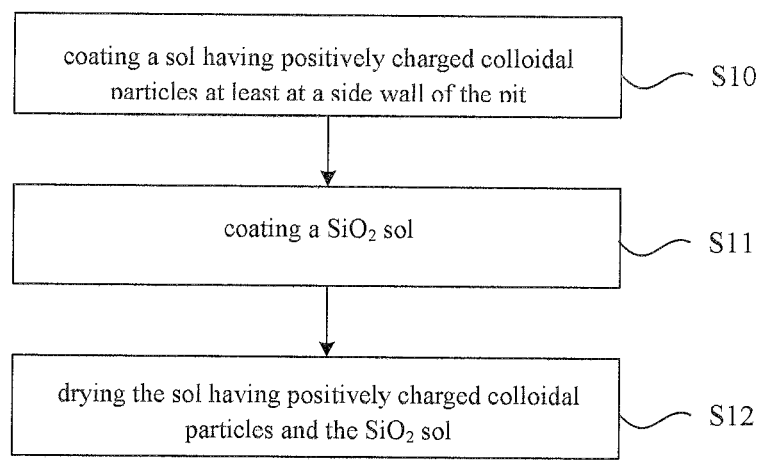
FIG. 3 is a flow chart illustrating a surface treatment method according to another embodiment of this disclosure.
Figure 4A:
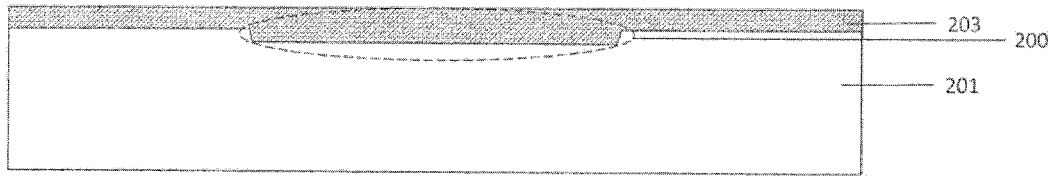
FIGS. 4a to 4c are schematic diagrams illustrating the formation of a smoothening layer on a glass substrate according to another embodiment of this disclosure.
Figure 4B:
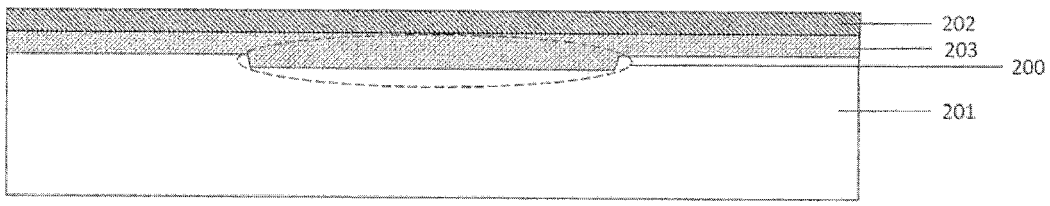
Figure 4C:
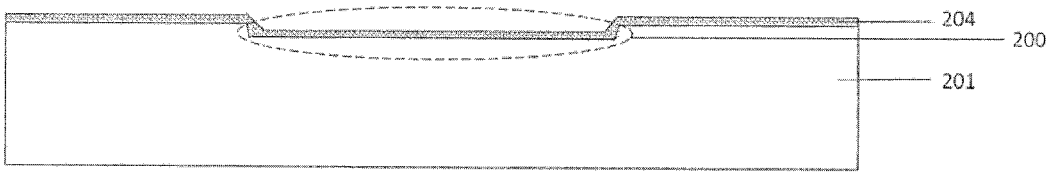

FIG. 3 is a flow chart illustrating a surface treatment method according to another embodiment of this disclosure. FIGS. 4a to 4c are schematic diagrams illustrating the formation of a $SiO_2$ sol and a sol having positively charged colloidal particles on a glass substrate according to an embodiment of this disclosure.

In this embodiment, a $SiO_2$ sol having negatively charged colloidal particles is used. Accordingly, on the basis of the embodiment as shown in FIG. 1, the method in FIG. 3 further comprises an optional step S10 of coating a sol having positively charged colloidal particles before a step S11.

A hydroxy group, which is easily bonded to a positively charged colloidal particle, is present on the surface of the glass substrate. Therefore, if a sol comprising positively charged colloidal particles is first coated and a sol comprising negatively charged colloidal particles is then coated, this contributes to the attachment of the sol having negatively charged colloidal particles to the surface of the glass substrate. Particularly, in this embodiment, this contributes to better attachment of the $SiO_2$ sol to the surface of the glass substrate.

Furthermore, the positively charged colloidal particle may comprise an alkali metal cation. A negatively charged $SiO_2$ colloidal particle may further react with this positively charged colloidal particle to produce an alkali metal silicate. Compared to $SiO_2$, this alkali metal silicate is closer to the component of the glass substrate, so that the glass substrate may be repaired more effectively.

Specific embodiments of this disclosure will be described in detail below.

As shown in S10 in FIG. 3 and FIG. 4a, a sol 203 having positively charged colloidal particles is coated in a position to be coated with a $SiO_2$ sol, before the $SiO_2$ sol is coated. As an example, the positively charged colloidal particle comprises an alkali metal cation. Particularly, a surface of the glass substrate 201 has a pit 200. This sol 203 having positively charged colloidal particles is coated at least at a side wall of the pit 200 of the glass substrate 201. Optionally, as shown in FIG. 4a, a sol 203 having positively charged colloidal particles is coated on the surface of the glass substrate 201 and at the bottom of the pit 200.

In an exemplary embodiment of this disclosure, the sol 203 having positively charged colloidal particles comprises a sodium polystyrene sulfonate (Na PSS) sol. This Na PSS sol may be obtained by mixing Na PSS and water to prepare a Na PSS aqueous solution having a mass fraction of 20% and then adjusting the pH value of this aqueous solution to 7 with the addition of HCl.

As shown in S11 in FIG. 3 and FIG. 4b, a $SiO_2$ sol 202 is coated on a sol 203 having positively charged colloidal particles.

In this embodiment, in order to allow $SiO_2$ colloidal particles in the $SiO_2$ sol to be negatively charged, as an example, aqueous ammonia may be used to adjust the pH value of the $SiO_2$ sol to 7.5. Particularly, anions are produced after hydration reaction occurs on the surface of $SiO_2$, and these anions are attached around $SiO_2$ particles so as to form negatively charged $SiO_2$ colloidal particles. Specific chemical reaction formulas are as represented by formulas (2) and (3).

$$SiO_2+H_2O=H_2SiO_3 \tag{2}$$

$$NH_3 \cdot H_2O+H_2SiO_3=HSiO_3^-+NH_4^++H_2O \tag{3}$$

After the $SiO_2$ sol 202 is coated, $SiO_2$ in the $SiO_2$ sol 202 may react with, for example, sodium polystyrene sulfonate in the sol 203 having positively charged colloidal particles to produce a silicate $Na_2SiO_3$, which is closer to the component of the glass substrate (the chemical reaction formula is as represented by formula (4)).

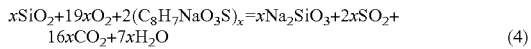
$$xSiO_2+19xO_2+2(C_8H_7NaO_3S)_x = xNa_2SiO_3+2xSO_2+16xCO_2+7xH_2O \tag{4}$$

As shown in S12 in FIG. 3 and FIG. 4c, the $SiO_2$ sol 202 and the sol 203 having positively charged colloidal particles are dried to obtain a final silicate layer 204.

In an exemplary embodiment of this disclosure, the temperature of drying may be about 250° C.

In an embodiment of this disclosure, there is further provided a production method of an array substrate, comprising the surface treatment method described above.

Figure 5:
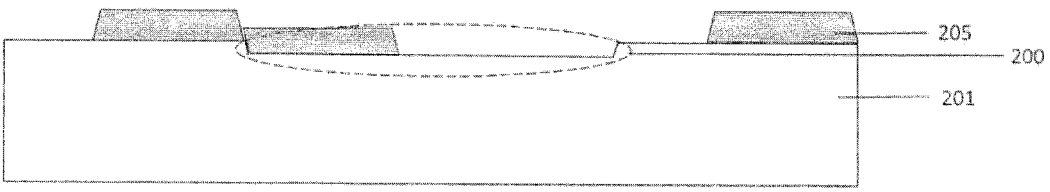
FIG. 5 is a schematic diagram illustrating the formation of a subsequent film layer on a glass substrate.
Figure 6:
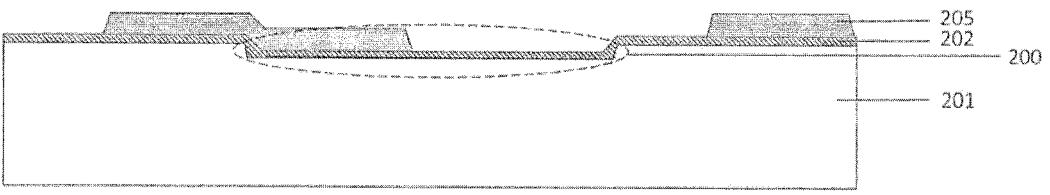
FIG. 6 is a schematic diagram illustrating the formation of a subsequent film layer on a glass substrate according to an embodiment of this disclosure.

FIG. 5 is a schematic diagram illustrating the formation of a subsequent film layer on an unsmoothened glass substrate having a pit. FIG. 6 is a schematic diagram illustrating the formation of a subsequent film layer on a smoothened glass substrate having a pit according to an embodiment of this disclosure.

As shown in FIG. 5, when a subsequent film layer 205 is formed on a glass substrate 201, since a pit 200 is present on a surface of the glass substrate 201, the subsequent film layer 205 will crack at an edge of the pit 200. The glass substrate 201 may be a gate electrode substrate in an array substrate. The subsequent film layer may be a gate electrode layer, a gate electrode insulating layer, or a source and drain electrode layer.

Particularly, the pit in the glass substrate may be caused by the processing of a gate electrode on a gate electrode substrate. When a gate electrode is formed by etching on a glass substrate, a pit will be left on the glass substrate by an etching liquid. This pit will influence the quality of a subsequent film layer such as a source and drain electrode layer. Furthermore, when there are problems with the gate electrode produced, the gate electrode layer will be typically removed (decapped) and a gate electrode layer produced again. In this case, the pit will influence the quality of the gate electrode layer formed again.

As shown in FIG. 6, when a subsequent film layer 205 is formed on a glass substrate 201 after repair according to an embodiment of this disclosure, since a $SiO_2$ sol 202 is used or a $SiO_2$ sol 202 and a sol 203 having positively charged colloidal particles are used to smoothen a pit 200, the height difference at an edge of the pit of the substrate is reduced and upper and lower edges of a side wall of the pit are smoothened so as to be capable of forming a continuous subsequent film layer 205. This method may be performed after the gate electrode is removed from the gate electrode substrate and before the gate electrode is formed again. This method may also be performed before the gate electrode insulating layer or the source and drain electrode layer is formed on the gate electrode substrate.

In an exemplary embodiment of this disclosure, the subsequent film layer 205 may be, for example, a gate electrode layer, gate electrode insulating layer, or a source and drain electrode layer. When the subsequent film layer is a conductive layer such as a gate electrode layer or a source and drain electrode layer, it is particularly important to prevent the occurrence of cracking therein.

Particularly, in an exemplary embodiment, the production method of this array substrate comprises:
    a step of forming a gate electrode on a glass substrate by etching, wherein a pit is formed on a surface of the glass substrate in the etching; and
    a step of performing surface treatment on the glass substrate according to the surface treatment method after the step of forming a gate electrode so as to smoothen an upper edge and a lower edge of the side wall of the pit.

The effect of the pit, which is formed on the surface of the glass substrate due to the production of the gate electrode, on properties of the array substrate may be effectively reduced by surface treatment.

In a further exemplary embodiment, the production method of this array substrate comprises:
    a step of removing the gate electrode after the step of forming a gate electrode;
    the step of performing the surface treatment after the step of removing the gate electrode; and
    a step of forming a gate electrode again on the glass substrate after the step of performing the surface treatment, wherein an orthographic projection of the gate electrode formed again on the glass substrate covers an orthographic projection of a side wall of the pit on the glass substrate.

When an array substrate is produced, due to the problems in the production of a gate electrode, the gate electrode is required to be removed (decapped) and a gate electrode is formed again by using the same glass substrate to prevent the waste of the substrate. At this time, the process of forming the gate electrode for the first time will leave a pit defect on the glass substrate. The effect of the pit defect on the gate electrode formed again may be effectively reduced by surface treatment. When a gate electrode is formed in a part having a pit, the cracking and failure will not easily occur due to the presence of a smoothening layer.

In a further exemplary embodiment, the production method of this array substrate further comprises:
    a step of forming a gate electrode insulating layer or a source and drain electrode layer after the step of performing the surface treatment, wherein an orthographic projection of the gate electrode insulating layer or the source and drain electrode layer on the glass substrate covers an orthographic projection of a side wall of the pit on the glass substrate.

Even if the gate electrode is not removed after the gate electrode is formed, the pit will influence the subsequent film layer formed thereon. The effect of the pit defect on the subsequent film layer may be effectively reduced by surface treatment. Particularly, the effect on the conductive film layer subsequently formed such as a source and drain electrode layer may be reduced.

This disclosure further provides an array substrate, comprising a glass substrate, wherein a surface of the glass substrate has a pit, a side wall of the pit has a $SiO_2$ layer or a silicate layer, and the $SiO_2$ layer or the silicate layer smoothens an upper edge and a lower edge of the side wall of the pit. For example, smoothening may be reducing a slope angle of a side wall of the pit. As described above, this array substrate may effectively prevent the effect of the pit on the subsequent film layer.

For example, the array substrate may comprise a gate electrode, a gate electrode insulating layer, and a source and drain electrode layer above a side wall of the pit, and the cracking and failure of them will not occur due to the side wall of the pit therebelow.

An embodiment of this disclosure provides a surface treatment method of a glass substrate having a pit on a surface thereof, a production method of an array substrate, and an array substrate, which can repair a pit on a surface of the glass substrate, and particularly, can smoothen a side wall of the pit and effectively reduce the height difference at an edge of the pit of the substrate, so that the possibility of the occurrence of the cracking of a material layer such as a conductive layer and the like, which is formed on the glass substrate, at the edge of the pit can be reduced, and optical properties of the glass substrate is improved.

The aforementioned description of embodiments is provided for the purpose of illustration and description, which are not intended to exhaust or limit this application. Respective elements or features of a specific embodiment are typically not limited to the specific embodiment. However, in a suitable case, these elements and features may be interchangeable and may be used in selected embodiments, even if not specifically shown or described. Likewise, modifications may also be made in many forms. These modifications should not be considered to depart from this application, and all of these modifications are comprised in the scope of this application.

What is claimed is:

1. A surface treatment method of a glass substrate having a pit on a surface thereof, wherein the method comprises:
    forming a layer of $SiO_2$ sol at least at a side wall of the pit; and
    drying the layer of $SiO_2$ sol to form a smoothening layer so as to smoothen an upper edge and a lower edge of the side wall of the pit; wherein a concentration of $SiO_2$ in the $SiO_2$ sol is about 0.005-0.02 g/ml; wherein the $SiO_2$ sol is prepared by mixing absolute ethanol, aqueous ammonia, and tetraethyl orthosilicate; wherein a molar ratio of aqueous ammonia to tetraethyl orthosilicate is about 3:1-5:1; wherein the surface treatment method further comprises: allowing $SiO_2$ colloidal particles to be negatively charged, and forming a layer of a sol having positively charged colloidal particles before forming the layer of the $SiO_2$ sol; wherein a pH value of the $SiO_2$ sol is adjusted to about 7.1-8.0.

2. The surface treatment method according to claim 1, wherein the smoothening layer comprises $SiO_2$.

3. The surface treatment method according to claim 1, wherein the sol having positively charged colloidal particles comprises alkali metal cations, and the smoothening layer comprises an alkali metal silicate.

4. The surface treatment method according to claim 1, wherein the sol having positively charged colloidal particles is a sodium polystyrene sulfonate sol, and the smoothening layer comprises sodium silicate.

5. The surface treatment method according to claim 1, wherein a temperature of the drying is about 220-280° C.

6. A production method of an array substrate, comprising the surface treatment method according to claim 1.

7. The production method according to claim 6, wherein the production method comprises:
    a step of forming a gate electrode on the glass substrate by etching, wherein the pit is formed on the surface of the glass substrate in the etching; and
    a step of performing surface treatment on the glass substrate by the surface treatment method after the step of forming the gate electrode so as to smoothen the upper edge and the lower edge of the side wall of the pit.

8. The production method according to claim 7, wherein the production method comprises:
    a step of removing the gate electrode;
    the step of performing the surface treatment after the step of removing the gate electrode; and
    a step of forming the gate electrode again on the glass substrate after the step of performing the surface treatment, wherein an orthographic projection of the gate electrode formed again on the glass substrate covers an orthographic projection of the side wall of the pit on the glass substrate.

9. The production method according to claim 7, wherein the production method further comprises:
    a step of forming a gate electrode insulating layer or a source and drain electrode layer after the step of performing the surface treatment, wherein an orthographic projection of the gate electrode insulating layer or the source and drain electrode layer on the glass substrate covers an orthographic projection of the side wall of the pit on the glass substrate.

10. An array substrate, comprising a glass substrate, wherein
    a surface of the glass substrate has a pit, a side wall of the pit has a $SiO_2$ layer or a silicate layer, and the $SiO_2$ layer or the silicate layer smoothens an upper edge and a lower edge of the side wall of the pit; wherein the array substrate comprises a gate electrode on the glass substrate, wherein an orthographic projection of the gate electrode on the glass substrate overlaps an orthographic projection of the side wall of the pit on the glass substrate; the array substrate further comprises a gate electrode insulating layer and source and drain electrode layers, wherein an orthographic projection of the gate electrode insulating layer and the source and drain electrode layers on the glass substrate overlaps an orthographic projection of the side wall of the pit on the glass substrate.

11. The array substrate according to claim 10, wherein the silicate layer is a sodium silicate layer.

* * * * *